(12) United States Patent
Lee et al.

(10) Patent No.: US 6,337,363 B1
(45) Date of Patent: Jan. 8, 2002

(54) EPOXY RESIN COMPOSITION WITH NON-HALOGEN, NON-PHOSPHORUS FLAME RETARDANT

(75) Inventors: Ming-Shi Lee; Ching-Jiuh Kang; Kuei-Lan Peng, all of Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/670,719

(22) Filed: Sep. 28, 2000

(30) Foreign Application Priority Data

May 25, 2000 (TW) .......................... 089110119

(51) Int. Cl.$^7$ ........................... C08K 3/36; C08L 63/02
(52) U.S. Cl. .................. 523/466; 524/266; 524/267; 525/476; 525/487
(58) Field of Search ................. 525/476, 487; 523/466; 524/266, 267

(56) References Cited

FOREIGN PATENT DOCUMENTS

JP        07268276     * 10/1995

* cited by examiner

*Primary Examiner*—Robert Dawson
*Assistant Examiner*—D. Aylward
(74) *Attorney, Agent, or Firm*—Sughrue Mion, PLLC

(57) ABSTRACT

The present invention discloses an epoxy resin composition with a non-halogen, non-phosphorus flame retardant, which comprises (a) 100 parts by weight of an epoxy resin; (b) 40–60 parts by weight of a phenolic novolac hardener; and (c) 5–60 parts by weight of a silica-novolac hybrid resin solution as a flame retardant.

10 Claims, No Drawings

EPOXY RESIN COMPOSITION WITH NON-HALOGEN, NON-PHOSPHORUS FLAME RETARDANT

BACKGROUND OF THE INVENTION

1. Field of the Invention

The present invention relates in general to an epoxy resin composition. More particularly, it relates to an epoxy resin composition containing a non-halogen, non-phosphorus flame retardant.

2. Description of the Related Arts

In recent years, environmental safety and in particular the air pollution has attracted worldwide attention. In this connection, electric and electronic appliances are required to be more environmentally friendly in addition to the requirement of high flame retardancy. To be more specific, the electric and electronic appliances are required to be resistant to flame and, at the same time, not to generate noxious gases. It has been customary in the past to use a glass/epoxy as a substrate of a printed circuit board on which electric and electronic appliances are to be mounted. In general, a brominated epoxy resin containing bromine as a flame retardant is used for forming the substrate of the printed circuit board.

The brominated epoxy resin certainly exhibits high flame retardancy. However, it generates noxious hydrogen bromide, polybromine dibenzofurans, and poybromine dibenzodioxins when burned. Moreover, antimony trioxide ($Sb_2O_3$), a synergist commonly used in company with brominated epoxy resin has recently been labeled as a suspected carcinogen.

To overcome this difficulty, epoxy resin compositions containing non-halogen flame retardants such as nitrogen compounds, phosphorus compounds have been developed. However, these flame retardants have the disadvantage that, in the instance of fire, they disintegrate releasing corrosive and partly toxic compounds like nitrogen oxide and derivatives of phosphoric acid. Thus, changing the brominated flame retardants into phosphorus or nitrogen-containing flame retardants does not achieve the goal of an environmentally friendly retardant.

The present invention is intended to provide an epoxy resin composition which does not contain a halogen, phosphorus, or nitrogen element but exhibits good flame retardancy.

SUMMARY OF THE INVENTION

Therefore, an object of the invention is to provide a halogen-free epoxy resin composition containing a non-halogen, non-phosphorus flame retardant, which does not release corrosive or toxic compounds in the instance of fire and at the same time has good flame retardancy.

The above and other objects are achieved by providing an epoxy resin composition comprising:

(a) 100 parts by weight of an epoxy resin;

(b) 40–60 parts by weight of a phenolic novolac hardener; and (c) 5–60 parts by weight of a silica-novolac hybrid resin solution as a flame retardant.

In the present invention, the silica-novolac hybrid resin solution (c) is a reaction product obtained by a sol-gel reaction between (c1) an organosilane and (c2) a phenolic novolac resin.

The flame-retardant epoxy resin composition of the present invention is suitable for application in printed circuit board industry to make environmental-friendly prepregs. Besides, the epoxy resin composition can find applications in other electronic industry as packaging materials.

DETAILED DESCRIPTION OF THE INVENTION

The present invention will be described in detail below.

The epoxy resin composition of the present invention contains a bisphenol A type epoxy resin as the component (a). As widely known to the art, the bisphenol A type epoxy resin is a reaction product between bisphenol A and, for example, epichlorohydrin. The bisphenol A type epoxy resin used in the present invention generally has an epoxy equivalent between 150 and 1000. The bisphenol A type epoxy resin used in the present invention is commercially available including, for example, EPIKOTE series manufactured by Yuka Sell Inc., Japan, and ARALDITE series manufactured by Ciba Geigy Inc. It is possible to use a single kind or a plurality of different kinds of the bisphenol A type epoxy resin in the resin composition of the present invention.

According to another aspect of the invention, the component (a) can be a mixture of a bisphenol A type epoxy resin and a novolac type epoxy resin. As widely known in the art, the novolac type epoxy resin is a resin obtained by a reaction between a novolac resin and epichlorohydrin. The novolac type epoxy resin used in the present invention should desirably have a softening point of 70–130° C., more preferably, 80–100° C. Such a resin is commercially available from, for example, Novolac epoxy series sold by Dow Company. It is possible to use a single kind or a plurality of different kinds of the novolac type epoxy resin in the resin composition of the present invention.

In the resin composition of the present invention, a phenolic novolac hardener is used as the component (b). The phenolic novolac resin is obtained by a condensation reaction between a phenolic compound and formaldehyde, which is carried out in the presence of an acidic catalyst. The phenolic compounds used for producing the novolac resin by the reaction with formaldehyde including, for example, phenol, cresol, and bisphenol A. The phenolic novolac resin used in the present invention has a molecular weight ranging from 100 to 30,000, more preferably, from 300 to 3,000. The phenolic novolac resin desirably has at least two phenolic hydroxyl groups in its molecule. It is possible to use a single kind or a plurality of different kinds of the phenolic novolac resin in the resin composition of the present invention.

The resin composition of the present invention contains a silica-novolac hybrid resin solution as a flame retardant (c). The silica-novolac hybrid resin solution is a reaction product obtained by a sol-gel reaction between (c1) an organosilane and (c2) a phenolic novolac resin. To be more specific, the silica-novolac hybrid resin is obtained by reacting a phenolic novolac resin with a nano-scale silica cluster derived from the organosilane, so that the phenolic novolac bonds to hydroxyl groups on the silica cluster to form a silica-based, multi-functional novolac resin.

The organosilanes (c1) used for producing the flame retardant of the present invention have the following general formula:

$$R^1{}_n Si(OR^2)_{4-n}$$

wherein n is 0, 1, 2, or 3; $R^1$ is alkyl having a terminal functional group selected from epoxy, alkenyl, amino, carboxy, or hydroxy; and $R^2$ is alkyl. Illustrative of organosilanes suitable for use herein are tetraethyl orthosilicate (TEOS), 3-aminopropyltriethoxy silane, and glycidyloxypropyltrimethyl silane.

The phenolic novolac resin (c2) is obtained by a condensation reaction between a phenolic compound and formaldehyde, which is carried out in the presence of an acidic catalyst. The phenolic compounds used for producing the novolac resin by the reaction with formaldehyde including, for example, phenol, cresol, and bisphenol A. The phenolic novolac resin used in the present invention has a molecular weight ranging from 100 to 30,000, more preferably, from 300 to 3,000. The phenolic novolac resin desirably has at least two phenolic hydroxyl groups in its molecule.

In carrying out the sol-gel reaction, the molar ratio of organosilane (c1) to phenolic novolac (c2) is preferably from 2 to 20, more preferably from 4 to 16. The reaction is suitably carried out in the presence of an acidic or basic catalyst such as hydrochloric acid, sulfuric acid, acetic acid, or ammonium hydroxide. The amount of the catalyst used is preferably in a range of 0.1–2 parts by weight, based on 100 parts by weight of the epoxy resin (a). The reaction is suitably carried out at a temperature ranging from 30 to 90° C., more preferably from 60 to 80° C.

The flame retardant of the present invention can form a supporting structure to support chars generated by phenolic novolac resins when burned, thereby separating inflammable components (e.g., epoxy resins) from heat.

The epoxy resin composition of the present invention may further comprise a curing accelerator (d) commonly used for accelerating the curing of an epoxy resin. To be more specific, the curing accelerator (d) includes, for example, imidazole compounds such as 2-ehtyl-4-methylimidazole and 1-benzyl-2-methylimidazole; and tertiary amines such as N',N-dimethylbenzylamine (BDMA). These compounds can be used singly or in the form of a mixture. The curing accelerator should be used in a small amount as far as the accelerator is sufficient for accelerating the curing of the epoxy resin. The amount of the curing accelerator used is preferably between 0.1 and 1 parts by weight based on 100 parts by weight of the epoxy resin (a).

A prepreg can be manufactured from the epoxy resin composition of the invention by the ordinary method. Specifically, the resin composition is diluted with a suitable organic solvent to prepare varnish, followed by coating or impregnating a porous glass substrate such as a glass non-woven fabric or a glass woven fabric with the varnish and subsequently heating the substrate to obtain a desired prepreg. Examples of suitable organic solvents for the dilution include N,N-dimethylformamide, acetone, isopropanol, ethylene glycol monomethyl ether, propylene glycol monomethyl ether, butanol, and methyl ethyl ketone. The prepreg thus obtained can be used for manufacturing a cooper-clad laminate, a multi-layered laminate, and a printed circuit board by conventional methods well known in the art.

Without intending to limit it in any manner, the present invention will be further illustrated by the following examples. In the examples, all parts and percentages are by weight unless otherwise specified.

PREPARATION EXAMPLE

A silica-novolac hybrid resin as a flame retardant was prepared by a sol-gel process as follows.

A mixture consisting of 100 parts of TEOS, 25.2 parts of polydimethylsilane (PDMS), 0.18 parts of hydrochloric acid, and 18.9 parts of isopropanol was stirred for 5 minutes, followed by addition of 18.9 parts of a phenolic novolac resin and 18.9 parts of propanol, and subsequently heating the resulting mixture at 60° C. for 60 minutes. Then, the reaction mixture was cooled at room temperature to obtain the desired silica-novolac hybrid resin solution.

EXAMPLE 1

66 parts by weight of methyl ethyl ketone (MEK) acting as a solvent was added to a mixture consisting of 100 parts of NPEL-128E (a bisphenol A type epoxy resin available from Nan Ya Plastics Corporation, having an epoxy equivalent of 184–190), 45 parts of a phoenolic novolac resin, 50 parts of the silica-novolac hybrid resin solution prepared in Preparation Example, and 0.3 parts by weight of 2-ethyl-4-methylimidazole, so as to prepare an epoxy resin varnish containing 65% of the resin solid component.

EXAMPLE 2

The same procedure as described in Example 1 was repeated except that 100 parts of NPEL-128E were replaced by 50 parts of NPEL-128E and 50 parts of Novolac epoxy 438 (a novolac epoxy resin available from Dow Company).

EXAMPLE 3

53 parts by weight of methyl ethyl ketone acting as a solvent was added to a mixture consisting of 100 parts of NPEL-128E, 42 parts of a phoenolic novolac resin, 100 parts of the silica-novolac hybrid resin solution prepared in Preparation Example, and 0.3 parts by weight of 2-ethyl-4-methylimidazole, so as to prepare an epoxy resin varnish containing 65% of the resin solid component.

EXAMPLE 4

The same procedure as described in Example 3 was repeated except that 100 parts of NPEL-128E were replaced by 50 parts of NPEL-128E and 50 parts of Novolac epoxy 438.

A glass cloth was impregnated with the epoxy resin varnish prepared in each of Examples 1–4, followed by drying the cloth to obtain a prepreg. Four prepregs thus obtained were evaluated for the flame retardancy according to UL-94. As shown in Table 1, all four prepregs exhibited an excellent flame retardancy of V-0.

TABLE 1

| Composition | Ex.1 | Ex.2 | Ex.3 | Ex.4 |
| --- | --- | --- | --- | --- |
| Epoxy 828 | 100 | 50 | 100 | 50 |
| Novolac epoxy 438 | 0 | 50 | 0 | 50 |
| Novolac | 45 | 45 | 42 | 42 |
| Flame retardant | 50 | 50 | 100 | 100 |
| Curing accelerator | 0.3 | 0.3 | 0.3 | 0.3 |
| MEK | 66 | 66 | 53 | 53 |
| Flame retardancy | V-0 | V-0 | V-0 | V-0 |

While the invention has been particularly shown and described with reference to the preferred embodiment thereof, it will be understood by those skilled in the art that various changes in form and details may be made without departing from the spirit and scope of the invention.

What is claimed is:

1. An epoxy resin composition containing a non-halogen, non-phosphorus flame retardant, comprising:

(a) 100 parts by weight of an epoxy resin;

(b) 40–60 parts by weight of a phenolic novolac hardener; and (c) 5–60 parts by weight of a silica-novolac hybrid resin solution as a flame retardant.

2. The epoxy resin composition as claimed in claim 1, wherein said epoxy resin (a) is a bisphenol A type epoxy resin.

3. The epoxy resin composition as claimed in claim 1, wherein said epoxy resin (a) comprises a bisphenol A type epoxy resin and a novolac type epoxy resin.

4. The epoxy resin composition as claimed in claim 2, wherein said bisphenol A type epoxy resin has an epoxy equivalent of 150 to 1,000.

5. The epoxy resin composition as claimed in claim 1, wherein said phenolic novolac hardener (b) has a molecular weight of 100 to 30,000.

6. The epoxy resin composition as claimed in claim 1, wherein said silica-novolac hybrid resin solution (c) is obtained by a sol-gel reaction between an organosilane (c1) and a phenolic novolac resin (c2).

7. The epoxy resin composition as claimed in claim 6, wherein said organosilane (c1) is represented by the following general formula:

$$R^1{}_n Si(OR^2)_{4-n}$$

wherein n is 0, 1, 2, or 3; $R^1$ is alkyl having a terminal functional group selected from epoxy, alkenyl, amino, carboxy, or hydroxy; and $R^2$ is alkyl.

8. The epoxy resin composition as claimed in claim 6, wherein said phenolic novolac resin (c2) has molecular weight of 100 to 30,000.

9. The epoxy resin composition as claimed in claim 1, further comprising:

(d) 0.1–1 parts by weight of a curing accelerator.

10. The epoxy resin composition as claimed in claim 9, wherein said curing accelerator is an imidazole compound or tertiary amine.

* * * * *